(12) United States Patent
Yamauchi

(10) Patent No.: US 6,856,549 B2
(45) Date of Patent: Feb. 15, 2005

(54) NON-VOLATILE SEMICONDUCTOR MEMORY DEVICE ATTAINING HIGH DATA TRANSFER RATE

(75) Inventor: Tadaaki Yamauchi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/665,010

(22) Filed: Sep. 22, 2003

(65) Prior Publication Data

US 2004/0196696 A1 Oct. 7, 2004

(30) Foreign Application Priority Data

Apr. 7, 2003 (JP) .................................. 2003-102864

(51) Int. Cl.⁷ .............................................. G11C 16/06
(52) U.S. Cl. .......................... 365/185.25; 365/185.2; 365/185.21; 365/185.11
(58) Field of Search .................. 365/185.25, 185.2, 365/185.21, 185.11

(56) References Cited

U.S. PATENT DOCUMENTS 6,442,070 B1 * 8/2002 Tanaka et al. ......... 365/185.22
6,487,124 B2 * 11/2002 Semi ..................... 365/185.25
6,507,525 B1 * 1/2003 Nobunaga et al. ......... 365/203

FOREIGN PATENT DOCUMENTS

JP        P2000-100186 A    4/2000

OTHER PUBLICATIONS

"A 1–Mbit CMOS EPROM with Enhanced Verification", Roberto Gastaldi et al., IEEE Journal of Solid–State Circuits, vol. 23, No. 5, Oct. 1988, pp. 1150–1156.

* cited by examiner

*Primary Examiner*—Hoai Ho
(74) *Attorney, Agent, or Firm*—McDermott Will & Emery LLP

(57) ABSTRACT

A reference cell is connected to two reference bit lines. In data access, when one reference bit line is driven to a selected state in response to a reference column select signal which is a decode result of a column address, a potential of a selected reference bit line is transmitted to a reference data bus line. A potential difference between the reference data bus line and a data bus line is amplified by a sense amplifier, and read data is output from an external terminal. During the access period, a reference bit line in a non-selected state is precharged to a ground potential in response to a reset signal at H level. In the next data access, when the non-selected reference bit line is selected, successive data reading is attained without waiting for a time period for precharging a bit line.

7 Claims, 10 Drawing Sheets

|  | ADD <3><2> | ADD <3><2> | ADD <3><2> | ADD <3><2> |
|---|---|---|---|---|
|  | 0  0 | 0  1 | 1  0 | 1  1 |
| CAUE<0> | H | L | L | L |
| CAUE<1> | L | L | L | H |
| CAUE<2> | L | L | H | L |
| CAUE<3> | L | H | L | L |

NON-VOLATILE SEMICONDUCTOR MEMORY DEVICE ATTAINING HIGH DATA TRANSFER RATE

BACKGROUND OF THE INVENTION

1. Field of the Invention

The present invention relates to a non-volatile semiconductor memory device, and more particularly to a non-volatile semiconductor memory device allowing electrical data writing and data erasing.

2. Description of the Background Art

As performance of a microprocessor or the like is enhanced, a demand for both a larger capacity and a higher speed in a non-volatile memory allowing electrical data writing and data erasing has become intense.

Accordingly, a number of non-volatile memories aiming at higher data transfer rate have conventionally been proposed, as described in Japanese Patent Laying-Open No. 2000-100186, and "A 1-Mbit CMOS EPROM with Enhanced Verification", Roberto Gastaldi et al., IEEE Journal of SOLID-STATE CIRCUITS, Vol. 23, No. Oct. 5, 1988, for example.

For example, a non-volatile memory described in Japanese Patent Laying-Open No. 2000-100186 achieves higher speed in data reading in the following manner. That is, a feedback signal is varied during a period for precharging a bit line and a reference bit line connected to a reference memory cell and during a period for sensing a potential difference between a selected bit line and the reference bit line. In this manner, an amount of charge supply to a bit line in precharging the same can be set to any level, and a loss in charge supply such as overprecharge of the bit line can be minimized.

Here, in a conventionally proposed non-volatile memory, a plurality of bit lines are provided, whereas a single reference bit line connected to a reference memory cell is generally provided.

Therefore, a period for precharging the reference bit line to a prescribed potential is necessary after a sensing operation in data reading, and next data reading is performed after the precharge period.

On the other hand, when data is successively output for each reading cycle such as in data reading in a burst mode, the precharge period imposes restriction on the data transfer rate. In other words, the non-volatile memory with such a configuration requires a sufficient precharge period before a sensing period.

This is a key factor inhibiting higher data transfer rate in the non-volatile memory in which higher integration is demanded, because the precharge period is extended with an increase in the number of memory cells connected to a bit line.

SUMMARY OF THE INVENTION

An object of the present invention is to provide a non-volatile semiconductor memory device attaining a high data transfer rate.

A non-volatile semiconductor memory device according to the present invention includes: a plurality of memory blocks having a plurality of memory cells each arranged in matrix of rows and columns; a plurality of word lines provided corresponding to the rows in the memory cell respectively; a plurality of bit lines provided corresponding to the columns in the memory cell respectively; a data bus line transmitting a potential of the bit line; a column select circuit electrically coupling one bit line selected from the plurality of bit lines in accordance with a column select result to the data bus line; a reference memory block having a plurality of reference memory cells arranged in matrix of rows and columns; a plurality of reference word lines provided corresponding to the rows in the reference memory cell respectively; a plurality of reference bit lines provided corresponding to the columns in the reference memory cell respectively; a reference data bus line transmitting a potential of the reference bit line; a reference column select circuit electrically coupling one reference bit line selected from the plurality of reference bit lines in accordance with a column select result to the reference data bus line; and a sense amplifier arranged corresponding to the data bus line and the reference data bus line, and amplifying a potential difference between the data bus line and the reference data bus line. The column select circuit precharges remainder of the bit lines in a non-selected state to a prescribed potential during a data reading period in which one of the plurality of bit lines is driven to a selected state. The reference column select circuit precharges remainder of the reference bit lines in a non-selected state to the prescribed potential during a data reading period in which one of the plurality of reference bit lines is driven to a selected state.

As described above, the non-volatile semiconductor memory device according to the present invention is configured to include a plurality of reference bit lines. As such, in a mode in which data is successively read, the precharge period for the reference bit line can run currently with an access period. Therefore, higher data transfer rate can be attained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
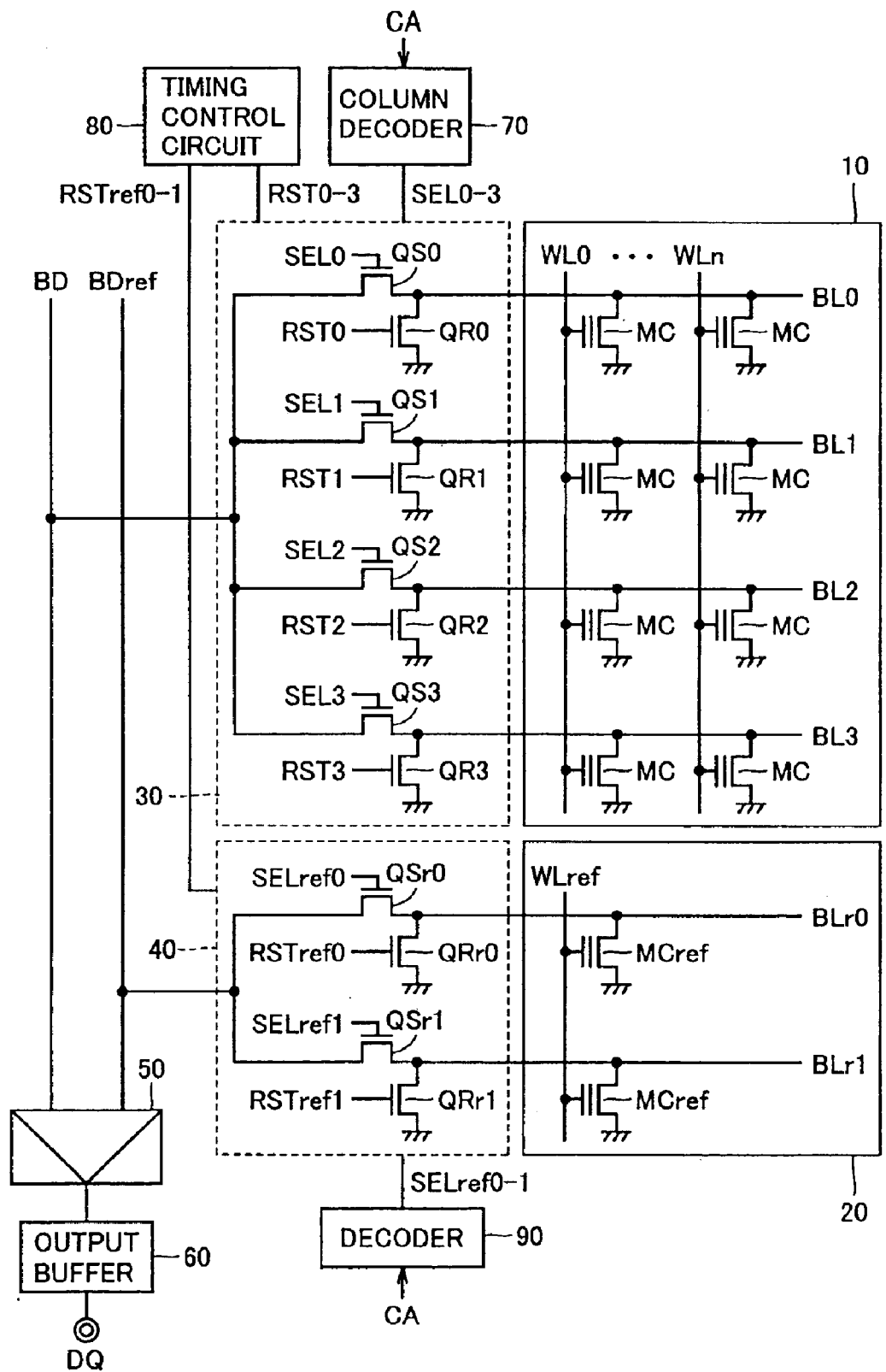
FIG. 1 illustrates a configuration of a portion involved in data reading in a non-volatile semiconductor memory device according to a first embodiment of the present invention.

In the following, embodiments of the present invention will be described in detail with reference to the figures. It is noted that the same reference characters refer to the same or corresponding components in the figures.

(First Embodiment)

FIG. 1 illustrates a configuration of a portion involved in data reading in a non-volatile semiconductor memory device according to a first embodiment of the present invention.

Though a flash memory will be described as a representative of a non-volatile semiconductor memory device in embodiments below, an EPROM (Erasable Programmable Read-Only Memory) or an EEPROM (Electrically Erasable Programmable Read-Only Memory) may be employed.

Referring to FIG. 1, a flash memory includes a memory array (not shown) having a plurality of memory cells MC arranged in matrix.

The memory array is divided into a plurality of memory blocks 10. FIG. 1 shows one memory block 10 as a representative.

Each memory block 10 is constituted with memory cells MC of n rows (n is a natural number)×4 columns. In memory block 10, word lines WL0–WLn and bit lines BL0–BL3 are arranged, corresponding to respective memory cell rows and memory cell columns.

In the following, word lines and bit lines are collectively denoted with reference characters WL and BL, respectively.

A reference memory block 20 having a reference memory cell MCref is arranged adjacent to memory block 10 in a direction of row. Reference memory block 20 is constituted with a plurality of reference memory cells MCref. In reference memory block 20, a reference word line WLref and reference bit lines BLr0–BLr1 are arranged, corresponding to respective reference memory cell MCref rows and reference memory cell columns.

In the following, reference word lines and reference bit lines are collectively denoted with reference characters WLref and BLr, respectively.

Though two reference bit lines BLr for supplying a reference voltage in data reading have been provided in the present embodiment, the present embodiment is not limited thereto. Alternatively, a plurality of reference bit lines BLr may be provided.

The flash memory further includes a column decoder 70 performing column selection in memory block 10 in accordance with a column address CA designated by an address signal, a row decoder (not shown) performing row selection in memory block 10, in accordance with a row address RA designated by the address signal, and a timing control circuit 80 controlling an operation timing of the flash memory.

The flash memory further includes a data bus line BD transmitting a potential of a selected bit line BL from memory block 10, a reference data bus line BDref transmitting a potential of a selected reference bit line BLr from reference block 20 which serves as a reference voltage in data reading, a sense amplifier 50 amplifying a potential difference between data bus line BD and reference data bus line BDref, and an output buffer 60 for supplying output data of sense amplifier 50 to an external terminal DQ.

A multiplexer 30 for activating one of four bit lines BL0–BL4 to a selected state in response to column select signals SEL0–SEL3 which are decode results of column address CA, and transmitting a potential of a selected bit line BL to data bus line BD is arranged between memory block 10 and data bus line BD.

Similarly, a multiplexer 40 for activating one of two reference bit lines BLr to a selected state in response to reference column select signals SELref0–SELref1 which are decode results of a low order address of column address CA, and transmitting a potential of a selected reference bit line BLr to reference data bus line BDref is arranged between reference memory block 20 and reference data bus line BDref.

Multiplexer 30 includes N-channel transistors QS0–QS3 coupled between bit lines BL0–BL3 and data bus line BD respectively, and N-channel transistors QR0–QR3 coupled between bit lines BL0–BL3 and a ground potential respectively.

In the following, N-channel transistors QS0–QS3, QR0–QR3 are collectively denoted with reference characters QS, QR, respectively.

N-channel transistors QS0–QS3 have column select signals SEL0–SEL3 input at the gates respectively. Any one of column select signals SEL0–SEL3 is selected and set to H (logic high) level, in response to the decode result of column address CA. Therefore, when any one of column select signals SEL0–SEL3 is activated, corresponding N-channel transistor QS is turned on, and electrically couples corresponding bit line BL to data bus line BD. Thus, the potential of selected bit line BL is transmitted to data bus line BD.

N-channel transistors QR0–QR3 have reset signals RST0–RST3 input at the gates respectively. Reset signals RST0–RST3 exhibit an active state (H level) during a standby period of the flash memory, and are inactivated to L (logic low) level when corresponding bit line BL is activated to the selected state in accordance with column address CA in the access period. Activation/inactivation of reset signal RST is controlled by timing control circuit 80.

Therefore, when the flash memory is in the standby period, and reset signals RST0–RST3 are all set to H level, N-channel transistor QR is turned on, and drives corresponding bit line BL to the ground potential. Consequently, bit line BL is precharged to the ground potential.

Though the precharge potential of bit line BL is assumed as the ground potential in the present embodiment, the present embodiment is not limited thereto, and a prescribed potential may be set.

On the other hand, when the flash memory is in the access period, and one bit line BL is activated to the selected state in accordance with column address CA, corresponding N-channel transistor QR enters OFF state in response to inactivation of corresponding reset signal RST, and precharging to selected bit line BL is stopped.

Accordingly, the potential of selected bit line BL is driven from the ground potential which is the precharge voltage to a data storage level of corresponding memory cell MC.

In summary, each bit line BL is in a state that it is precharged to the ground potential, and electrically isolated from data bus line BD during the standby period. Then, when one bit line BL is activated to the selected state in accordance with column address CA in the access period, selected bit line BL and data bus line BD are electrically coupled to each other. A reading potential of corresponding memory cell MC to bit line BL is thus transmitted to data bus line BD. Here, each non-selected bit line BL is in the precharge state, and held at the ground potential.

Multiplexer 40 includes N-channel transistors QSr0–QSr1 coupled between reference bit lines BLr0–BLr1 and reference data bus line BDref respectively, and N-channel transistors QRr0–QRr1 coupled between reference bit lines BLr0–BLr1 and the ground potential respectively.

In the following, N-channel transistors QSr0–QSr1, QRr0–QRr1 are collectively denoted with reference characters QSr, QRr, respectively.

N-channel transistors QSr0–QSr1 have reference column select signals SELref0–SELref1 input at the gates respectively. Any one of reference column select signals SELref0–SELref1 is selected and activated to H (logic high) level, in response to a decode result of the least significant address CA<0> of column address CA. In other words, when the least significant address CA<0> attains 0, reference column select signal SELref0 activated to H level is internally output as a decode result indicating an "even number" in decoder 90. On the other hand, when the least significant address CA<0> attains 1, reference column select signal SELref1 activated to H level is output as a decode result indicating an "odd number" in decoder 90.

Accordingly, when reference column select signal SELref0 is activated, corresponding N-channel transistor QSr0 is turned on, and corresponding reference bit line BLr0 and reference data bus line BDref are electrically coupled to each other. The potential of selected reference bit line BLr0 is thus transmitted to reference data bus line BDref.

On the other hand, when reference column select signal SELref1 is activated, corresponding N-channel transistor QSr1 is turned on, and corresponding reference bit line BLr1 and reference data bus line BDref are electrically coupled to each other. The potential of selected reference bit line BLr1 is thus transmitted to reference data bus line BDref N-channel transistors QRr0–QRr1 have reference reset signals RSTref0–RSTref1 input at the gates respectively. Reference reset signals RSTref0–RSTref1 exhibit an active state (H level) during the standby period of the flash memory, and are inactivated to L level when corresponding reference bit line BLr is activated to the selected state in accordance with the least significant address CA<0> of column address CA in the access period. A timing of activation/inactivation of reference reset signal RSTref is controlled by timing control circuit 80 so as to be in synchronization with reset signal RST.

Therefore, when the flash memory is in the standby period, and reset signals RSTref0–RSTref1 are all set to H level, N-channel transistor QRr is turned on, and couples corresponding reference bit line BLr to the ground potential. Consequently, reference bit line BL is precharged to the ground potential.

On the other hand, when the flash memory is in the access period, and one reference bit line BLr is activated to the selected state in accordance with the least significant address of column address CA, corresponding reset signal RSTref is inactivated. Accordingly, corresponding N-channel transistor QRr enters OFF state, and precharging to reference bit line BLr is stopped.

Here, N-channel transistor QRr is turned on in response to reference reset signal RSTref in an active state, and the other reference bit line BLr is precharged to the ground potential.

In summary, each reference bit line BLr0–BLr1 is in a state that it is precharged to the ground potential during the standby period, and electrically isolated from reference data bus line BDref Then, when one reference bit line BLr is activated to the selected state in accordance with the least significant address of column address CA in the access period, selected reference bit line BLr and reference data bus line BDref are electrically coupled to each other. Thus, the potential of reference bit line BLr connected to corresponding reference memory cell MCref is transmitted to reference data bus line BDref. The potential transmitted to reference data bus BDref serves as a reference potential in the sensing operation, when input to sense amplifier 50.

Here, the other reference bit line BLr in the non-selected state is held to the ground potential, that is, still in the precharge state, even during the access period. Therefore, if non-selected reference bit line BLr is activated to the selected state in the next access period, successive data reading can be performed without waiting for the precharge period. This will effectively implement higher data transfer rate, because the precharge period of reference bit line BLr can run concurrently with the access period in successive data reading from the plurality of memory cells.

Figure 2:
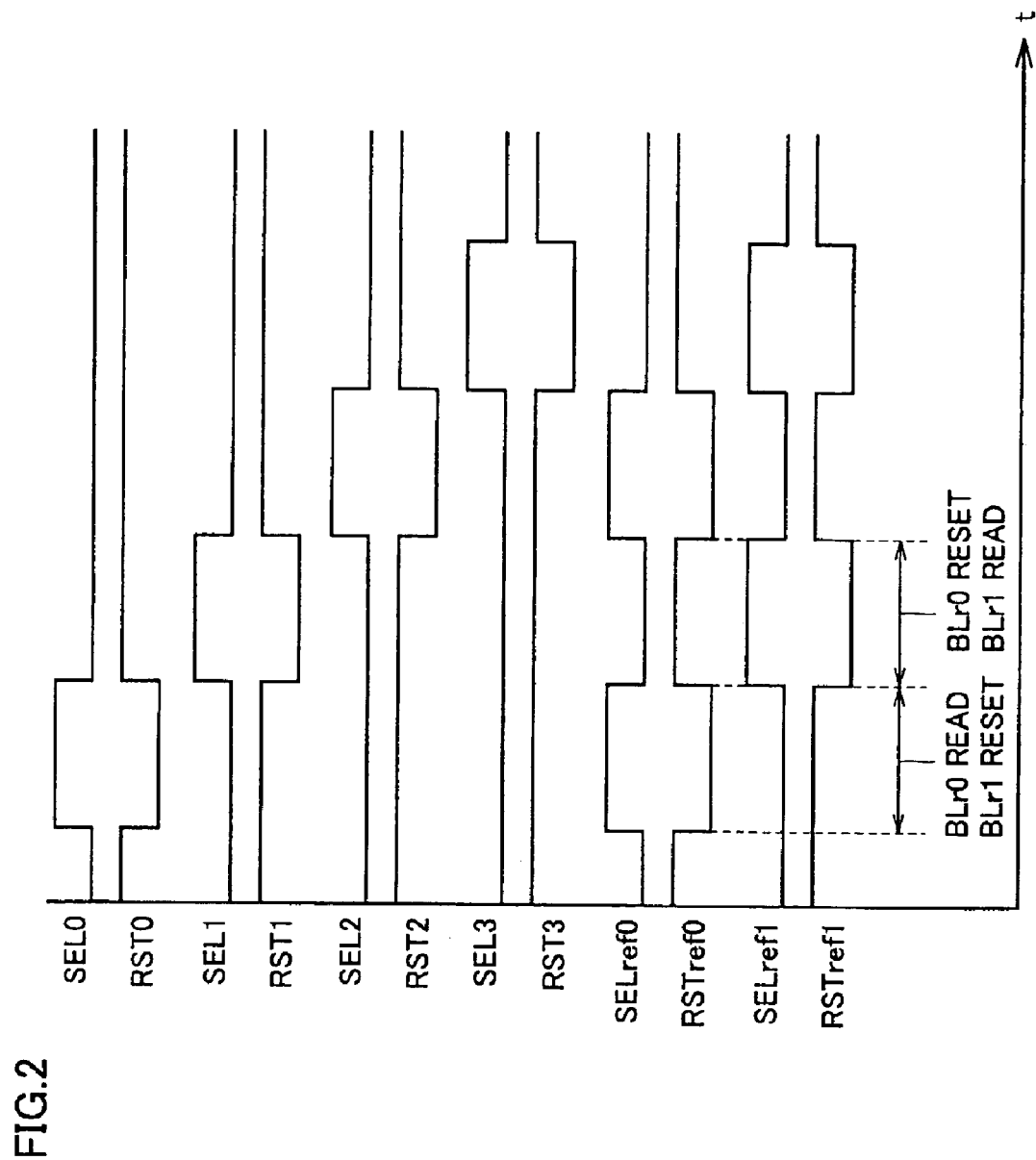
FIG. 2 is a timing chart of a column select signal SEL, a reset signal RST, a reference column select signal SELref, and a reference reset signal RSTref, output respectively from a column decoder 70, a timing control circuit 80, and a decoder 90.

FIG. 2 is a timing chart of column select signal SEL, reset signal RST, reference column select signal SELref, and reference reset signal RSTref output respectively from column decoder 70, timing control circuit 80, and decoder 90.

Column select signal SEL is output from column decoder 70 in synchronization with an internal clock signal, as a decode result of column address CA. As shown in FIG. 2, when the bit line is selected in such an order as BL0, BL1, BL2, BL3, for example, in accordance with column address CA, column select signal SEL is activated to H level in the order of SEL0, SEL1, SEL2, SEL3.

On the other hand, reset signal RST output from timing control circuit 80 is activated to H level when corresponding bit line BL is not selected, and inactivated to L level when it is selected. Therefore, if column select signals SEL0–SEL3 are sequentially activated, reset signal RST is inactivated to L level in the order of RST0, RST1, RST2, RST 3, in synchronization with the activation timing of corresponding column select signal SEL.

As described, when bit line BL is selected in the order of BL0, BL1, BL2, BL3, corresponding column select signal SEL is sequentially activated, and the potential of the selected bit line is transmitted to data bus line BD. At the same time, corresponding reset signal RST is sequentially inactivated, and precharging to corresponding bit line BL is stopped.

In addition, when the access period of select bit line BL ends, corresponding column select signal SEL is inactivated, and corresponding reset signal RST is activated. Then, transition to the precharge period for corresponding bit line BL takes place.

In synchronization with column selection in memory block 10, column selection in reference memory block 20 is performed, based on reference column select signal SELref and reference reset signal RSTref shown in FIG. 2.

Reference column select signal SELref is generated by decoding the least significant address CA<0> of column address CA. As described above, when the least significant address CA<0> attains 0, that is, when an even-numbered address is designated for access, SELref0 is selected and activated to H level. On the other hand, when the least significant address CA<0> attains 1, that is, when an odd-numbered address is designated for access, SELref1 is selected and activated to H level.

Therefore, when memory block 10 is accessed in the alternate order of the even-numbered address and the odd-numbered address as shown in FIG. 2, reference column select signal SELref is activated in the order of SELref0, SELref1, SELref0, SELref1, and so on.

Accordingly, corresponding reference bit lines BLr0, BLr1 are alternately selected and activated, and transmit the potential corresponding to the storage data of reference cell MCref to reference data bus line BDref.

Thus, when the even-numbered address is designated for access, the potential of bit line BL connected to selected memory cell MC is transmitted to data bus line BD, and the potential of reference bit line BLr0 connected to selected reference memory cell MCref is transmitted to reference data bus line BDref. Sense amplifier 50 amplifies the potential difference between data bus line BD and reference data bus line BDref, and outputs read data via external terminal DQ.

On the other hand, reference bit line BLr0 is selected and activated in response to the even-numbered address, and concurrently, reference bit line BLr1 in the non-selected state is precharged to the ground potential in response to reference reset signal RSTref at H level.

Therefore, even when the odd-numbered address is designated for access in succession to the access to the even-numbered address, the data reading operation can immediately be performed, because reference bit line BLr1 will have been precharged.

Similarly, while reference bit line BLr1 has been selected and activated in response to the odd-numbered address, reference bit line BLr0 in the non-selected state is precharged to the ground potential. Therefore, even when the even-numbered address is designated for access in succession to the access to the odd-numbered address, reference bit line BLr0 can enter the access period immediately, without requiring the precharge period.

This is substantially equal to the fact that the precharge period runs concurrently with the access period, and a cycle duration can be reduced to half at the shortest.

As described above, according to the first embodiment of the present invention, a plurality of reference bit lines for supplying the reference voltage to the sense amplifier are provided, and data reading is performed by sequentially selecting the plurality of reference bit lines in accordance with the column address. On the other hand, the non-selected reference bit line is precharged during the access period of the selected reference bit line. Thus, the precharge period is not necessary before and after the access period, and successive data reading can be performed with high speed.

(First Variation of First Embodiment)

Figure 3:
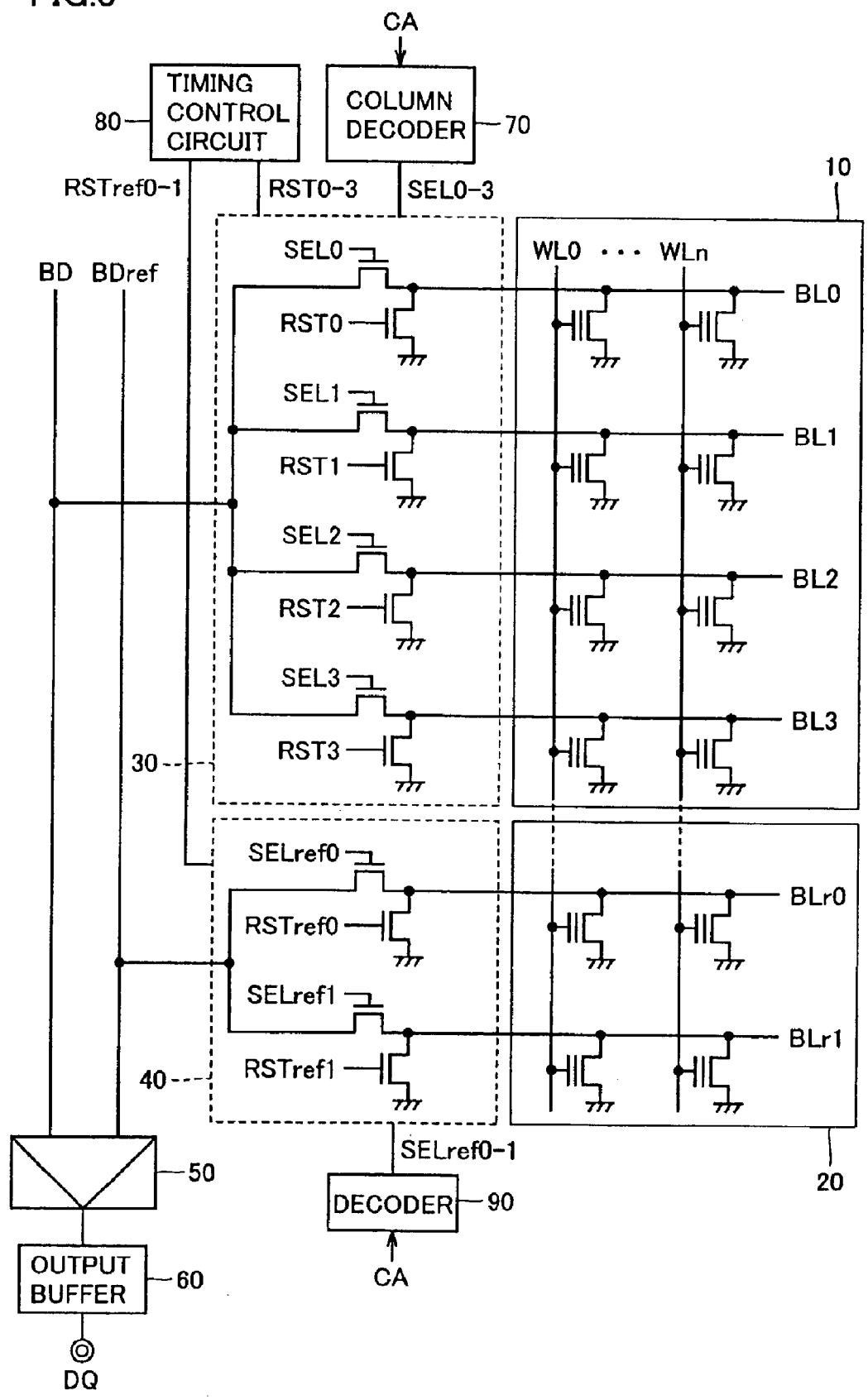
FIG. 3 illustrates a configuration of a portion involved in data reading in a flash memory according to a first variation of the first embodiment of the present invention.

FIG. 3 illustrates a configuration of a portion involved in data reading in a flash memory according to a first variation of the first embodiment of the present invention.

Referring to FIG. 3, a basic configuration of a flash memory according to the present variation is common to that of the flash memory in the first embodiment in FIG. 1. On the other hand, it is different in that word line WL arranged corresponding to each memory cell row in memory block 10 is shared as reference word line WLref provided corresponding to each memory cell row in reference memory cell MCref in reference memory block 20. It is to be noted that detailed description of components common to those in the flash memory in FIG. 1 will not be repeated.

In response to activation of word line WL, a prescribed voltage of the control gate is applied to reference memory cell MCref at the same time as memory cell MC, and reference bit line BLr is driven to the potential corresponding to the storage data.

The flash memory according to the present variation is configured such that word line WL is shared by memory cell MC and reference memory cell MCref. Therefore, regularity in a pattern of normal memory cells MC is maintained, and reference memory block 20 can be formed within memory block 10. In other words, according to the flash memory of the present variation, a manufacturing process can effectively be simplified.

In the present configuration as well, the column select operation is performed in a manner similar to that in the first embodiment. In other words, during the access period, one of reference bit lines BLr is selected in accordance with column address CA, and concurrently, non-selected reference bit line BLr is precharged. Thus, higher data transfer rate can be attained also in successive data reading.

(Second Variation of First Embodiment)

Figure 4:
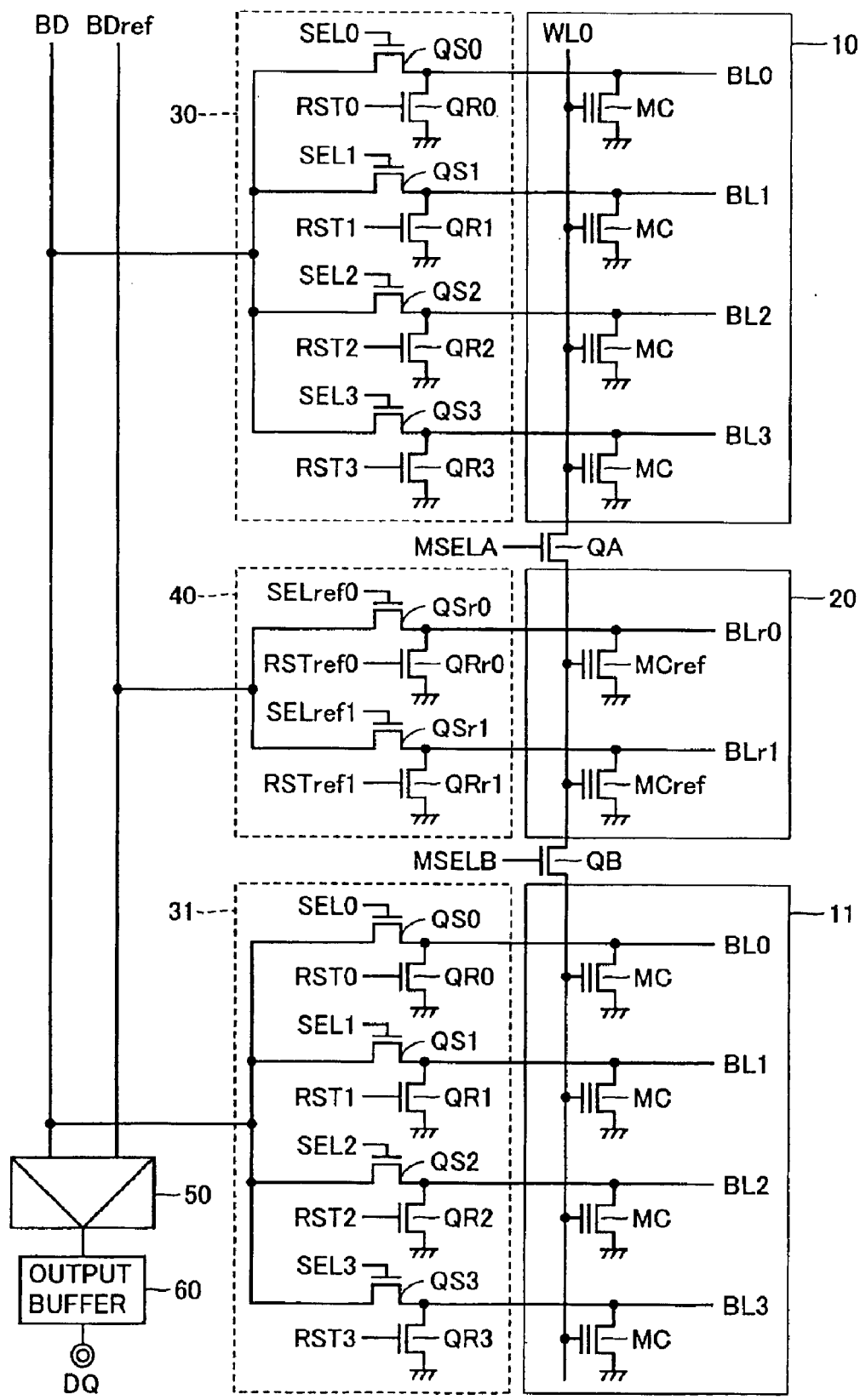
FIG. 4 illustrates a configuration of a portion involved in data reading in a flash memory according to a second variation of the first embodiment of the present invention.

FIG. 4 illustrates a configuration of a portion involved in data reading in a flash memory according to a second variation of the first embodiment of the present invention.

Referring to FIG. 4, a basic configuration of a flash memory according to the present variation is common to that of the flash memory in the first embodiment in FIG. 1, however, different in that reference memory block 20 is shared by a plurality of memory blocks.

In the present variation, an example in which reference memory block 20 is shared by memory blocks 10, 11 arranged adjacent to reference memory block 20 in up and down direction of row will be described. It is to be noted that description of components common to those in FIG. 1 will not be repeated.

The flash memory in the present variation includes memory blocks 10, 11 having a plurality of memory cells MC arranged in matrix of rows and columns. As shown in FIG. 4, word line WL corresponding to each memory cell row is arranged so as to extend on memory blocks 10, 11 and reference memory block 20. For example, the plurality of memory cells MC and reference memory cell MCref within memory blocks 10, 11 are connected to word line WL0.

In word line WL, N-channel transistors QA, QB as connection transistors are coupled between memory block 10 and reference memory block 20, as well as between memory block 11 and reference memory block 20, respectively.

N-channel transistors QA, QB couple/decouple memory blocks 10, 11 to/from reference memory block 20, in response to activation/inactivation of memory block select signals MSELA, MSELB input to the gates respectively.

Memory block select signals MSELA, MSELB electrically couple reference memory block 20 to a selected memory block, based on an address signal designating memory cell MC to be accessed. Therefore, for example, when memory cell MC within memory block 10 is designated for access, memory block select signal MSELA is selected and activated.

When N-channel transistor QA is turned on in response to memory block select signal SELA at H level, memory block 10 and reference memory block 20 are coupled by word line WL0. Accordingly, potentials to which selected bit line BL and selected reference bit line BLr are driven in response to a voltage applied to selected word line WL0 are transmitted to data bus line BD and reference data bus line BDref through multiplexers 30, 40 respectively, and a potential difference therebetween is amplified in sense amplifier 50. Read data is output from sense amplifier 50.

Similarly, when memory cell MC within memory block 11 is designated for access, memory block select signal MSELB is selected and activated. When N-channel transistor QB is turned on in response to this, memory block 11 and reference memory block 20 are coupled by word line WL0. Consequently, potentials to which selected bit line BL and selected reference bit line BLr are driven in response to a voltage applied to selected word line WL0 are transmitted to data bus line BD and reference data bus line BDref through multiplexers 31, 40 respectively. In addition, a potential difference therebetween is amplified in sense amplifier 50, and read data is output therefrom.

The present variation is configured such that reference memory block 20 is shared by two memory blocks 10, 11. As such, an increase in a circuit size can be suppressed, compared with a configuration in which a reference memory cell is provided for each memory block. Therefore, the increase in the circuit size due to presence of the plurality of reference bit lines can be suppressed also in the flash memory that has attained higher integration, and high data transfer rate can be achieved.

Here, the number of memory blocks sharing a reference memory block is not limited to two as shown in the present variation, and alternatively, two or more memory blocks may be provided. In such a case, the present variation should be configured such that connection transistors in the number corresponding to that of memory blocks sharing the reference memory cell are coupled on word line WL, and one memory block select signal is activated in accordance with the address signal.

(Second Embodiment)

Figure 5:
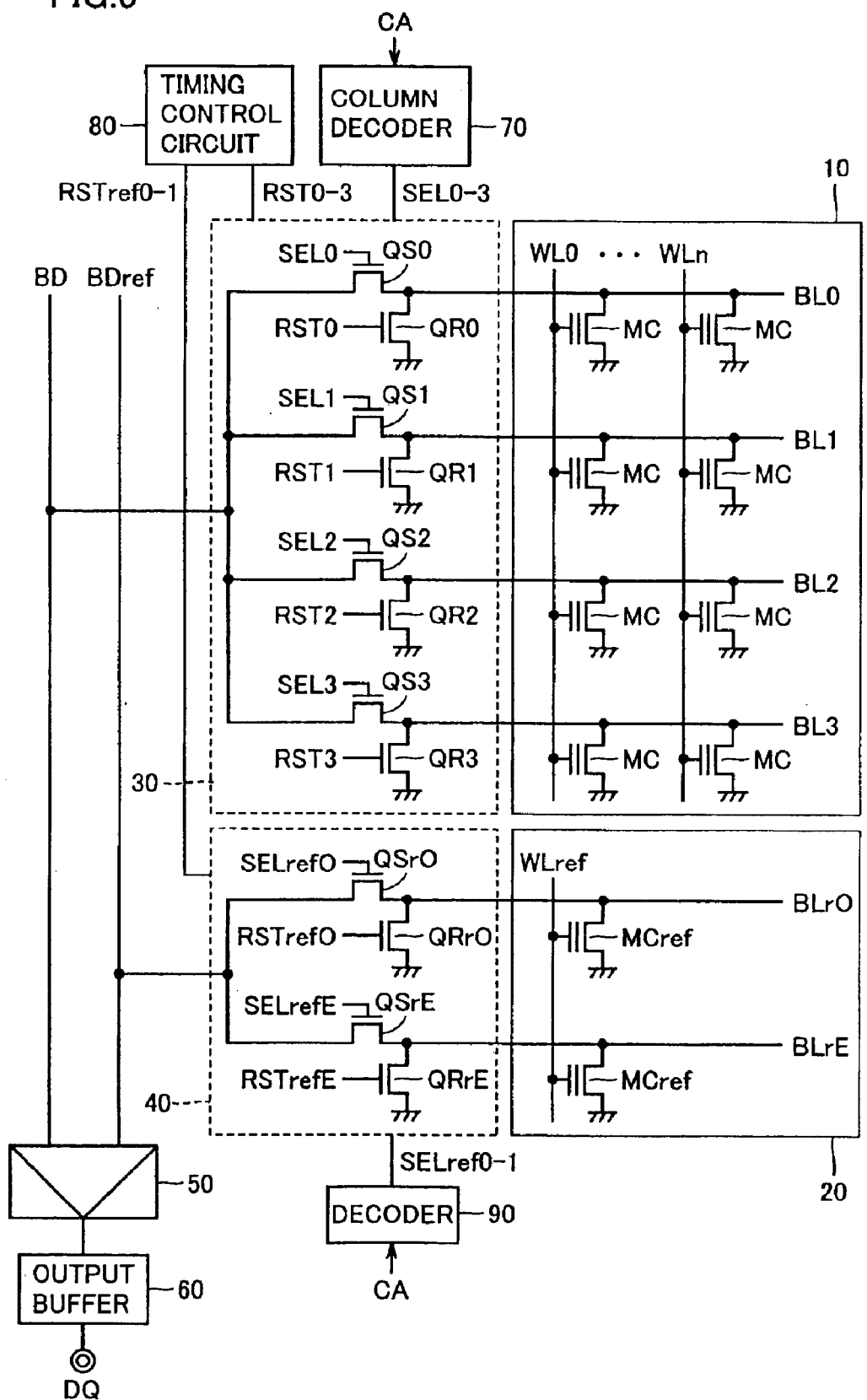
FIG. 5 illustrates a configuration of a portion involved in data reading in a flash memory according to a second embodiment of the present invention.

FIG. 5 illustrates a configuration of a portion involved in data reading in a flash memory according to a second embodiment of the present invention.

Referring to FIG. 5, the flash memory has a circuit configuration similar to that in the flash memory of the first embodiment shown in FIG. 1. In the present embodiment, an example in which data reading is performed in a burst mode where data is successively output for each reading cycle in the flash memory will be described.

In burst read, two reference bit lines BLr corresponding to the even-numbered address and the odd-numbered address are arranged in reference memory cell block contained in the flash memory. In the following, reference bit lines corresponding to the odd-numbered address and the even-numbered address are denoted as BLrO and BLrE respectively.

Multiplexer 40 coupled between reference memory block 20 and reference data bus line BDref includes N-channel transistors QSrO, QSrE coupled between reference bit lines BLrO, BLrE and reference data bus line BDref. The gates of N-channel transistors QSrO, QSrE receive reference column select signals SELrefO–SELrefE which are decode results of column address CA input from decoder 90 respectively.

Multiplexer 40 further includes N-channel transistors QRrO, QRrE coupled between each reference bit line BLr and the ground potential. The gates of N-channel transistors QRrO, QRrE receive reference reset signals RSTrefO–RSTrefE input from timing control circuit 80 respectively.

Here since configuration of other portions (memory block 10 and multiplexer 30, for example) other than reference memory block 20 and multiplexer 40 is the same as that shown in the first embodiment, detailed description thereof will not be repeated.

In the above configuration, initially, when an address signal is externally input along with a reading instruction, column decoder 70 selects from each memory block 10, a group of bit lines BL in which reading in the burst mode is to be performed, in accordance with a high order bit of column address CA defined in accordance with a burst length. Here, a burst length represents length of data that is successively output.

In the present embodiment, it is assumed that the burst length is set to 4, and two even-numbered bit lines BL0, BL2 and two odd-numbered bit lines BL1, BL3 in memory block 10 are selected.

A leading address (hereinafter, also referred to as a "start address"), by which data is initially read, for bit line BL selected in accordance with the burst length of 4, is designated in accordance with 2-bit low-order column address CA<1:0>, and accordingly, a next address is designated in an ascending order in synchronization with the clock signal. In other words, if the start address is the even-numbered address, next odd-numbered address is also designated in an ascending order.

When the burst length is set to 4 as in the present embodiment, bit lines BL0–BL3 corresponding to addresses 0#–3# are selected in accordance with a high order bit of column address CA.

When the start address is set to 0#, bit line BL0 of address 0# is selected, and read data of bit lines BL1, BL2, BL3 corresponding to addresses 1#, 2#, 3# in an ascending order is sequentially output from output buffer 60.

In such burst read, if the start address is designated based on column address CA, the next address will be designated in an ascending order. Therefore, bit line BL corresponding to the even-numbered address and the odd-numbered address is sequentially selected, and data reading is performed.

This means that reference bit line BLrE corresponding to the even-numbered address and reference bit line BLrO corresponding to the odd-numbered address are sequentially selected also in reference bit line BLr.

Therefore, when the start address is designated as 0#, corresponding bit line BL0 and reference bit line BLrE are driven to the selected state, and concurrently, bit line BL1 and reference bit line BLrO can be precharged to the same potential (the ground potential in the present embodiment). Accordingly, the sensing operation for address 1# can start immediately after start address 0# is sensed, and the data transfer rate is improved.

In the present embodiment, the burst length has been set to 4, and bit lines BL0–BL3 have been selected in an ascending order, assuming the start address designated in accordance with lower 2 bits of column address CA as the starting point. A similar effect can also be obtained even when the burst length and the start address are varied.

For example, when the burst length is set to 8, following configuration is possible. That is, when the start address is designated in accordance with the low order bit of column address CA<2:0>, reference bit line BLrO on the odd-numbered side and reference bit line BLrE on the even-numbered side are alternately precharged, in accordance with the even-numbered address and the odd-numbered address designated in an ascending order.

As described above, according to the second embodiment of the present invention, in the burst mode in which data is successively read, the reference bit line in the non-selected state is precharged in a complementary manner during a period in which the reference bit line corresponding to the even-numbered address and the reference bit line corresponding to the odd-numbered address assuming the start address as the starting point are alternately accessed. In this manner, a reading cycle time can be reduced to half at the shortest, and high data transfer rate can be achieved.

(Third Embodiment)

In the flash memories in the first and second embodiments above, the precharge period of bit line BL tends to account for large part of the cycle time, if the number of memory cells MC connected to one bit line BL increases with higher integration. Therefore, this may impose restriction on attaining higher data transfer rate.

In the present embodiment, a flash memory allowing high-speed data reading without being affected by the precharge period of bit line BL regardless of high integration is proposed.

Figure 6:
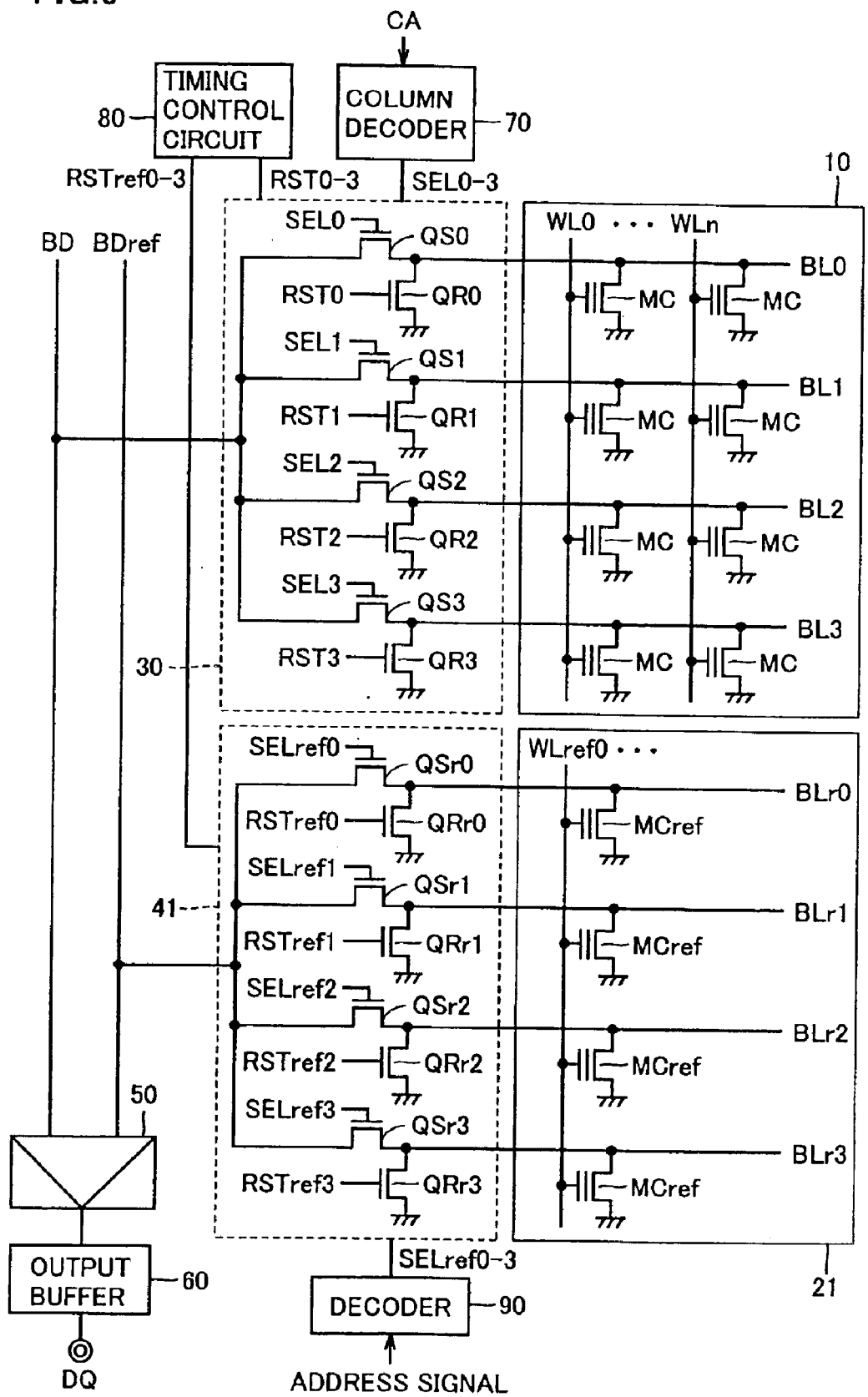
FIG. 6 illustrates a configuration of a portion involved in data reading in a flash memory according to a third embodiment of the present invention.

FIG. 6 illustrates a configuration of a portion involved in data reading in a flash memory according to a third embodiment of the present invention.

Referring to FIG. 6, the flash memory includes memory block 10 having a plurality of memory cells MC arranged in matrix of rows and columns, a reference memory block 21 having a plurality of reference memory cells MCref, data bus line BD transmitting the potential of bit line BL connected to selected memory cell MC within memory block 10, reference data bus line BDref transmitting the potential of reference bit line BLr connected to selected reference memory cell MCref within reference memory block 21, sense amplifier 50 amplifying a potential difference between data bus line BD and reference data bus line BDref, and output buffer 60 for outputting read data output by sense amplifier 50 to external terminal DQ.

The flash memory further includes multiplexer 30 receiving column select signal SEL as a decode result of column address CA from column decoder 70, and electrically coupling corresponding bit line BL to data bus line BD.

In addition, the flash memory further includes a reference multiplexer 41 receiving reference column select signal SELref as a decode result of a low order address of column address CA from decoder 90, and electrically coupling corresponding reference bit line BLr to reference data bus line BDref.

The configuration above is similar to that in the flash memory in the first embodiment described previously. Therefore, detailed description of the configuration and operation of each part will not be provided.

According to a configuration of the flash memory in the present embodiment, the number of reference bit lines BLr corresponding to reference memory cell MCref is increased from two to four in reference memory block 21 and reference multiplexer 41, in accordance with higher integration. Accordingly, the number of signals, that is, reference column select signal SELref and reference reset signal RSTref, is increased to four respectively. In this regard, reference memory block 21 and reference multiplexer 41 are different from reference memory block 20 and multiplexer 40 including two reference bit lines BLr and activated with the chance of ½ in the first embodiment.

Specifically, reference memory block 21 includes four reference bit lines BLr0–BLr3 corresponding to each reference memory cell column, and a plurality of reference memory cells MCref are connected to each reference bit line BLr.

Therefore, when reference memory cell MCref is simultaneously designated for access in synchronization with memory cell MC designated for access, corresponding one reference bit line BLr out of four reference bit lines BLr0–BLr3 is driven to the selected state.

Reference multiplexer 41 includes N-channel transistors QSr0–QSr3 coupled between reference bit lines BLr0–BL3 and reference data bus line BDref respectively, and N-channel transistors QRr0–QRr3 connected between reference bit lines BLr0–BLr3 and the ground potential respectively.

N-channel transistors QSr0–QSr3 are turned on/off in response to activation/inactivation of reference column select signals SELref0–SELref3 from decoder 90, and couple corresponding reference bit line BLr to reference data bus line BDref.

N-channel transistors QRr0–QRr3 are turned on/off in response to activation/inactivation of reference reset signals RSTref0–RSTref3 from timing control circuit 80, and couple corresponding reference bit line BLr to the ground potential which is the precharge potential.

A data reading operation performed in the flash memory having the above-mentioned configuration in the present embodiment will now be described.

In data access, it is assumed that a word line WLi (i is an integer not smaller than 0 and not larger than n) corresponding to the selected memory cell row and a reference word line WLrefi are simultaneously driven to the selected state. A prescribed voltage is applied to the control gates of transistors in memory cell MC and reference memory cell MCref through selected word line WLi and selected reference word line WLrefi.

Here, a current may flow or may not flow in the transistor in memory cell MC, depending on whether or not electrons are injected to the floating gate. The potential of selected bit line BL generated by this current (for example, BL0) is transmitted to data bus BD through multiplexer 30.

Similarly, the potential generated in selected reference bit line BLr0 by the current flowing in the transistor in reference memory cell MCref is transmitted to reference data bus line BDref through reference multiplexer 41.

The storage data in memory cell MC is read by detecting the potential difference between data bus line BD and reference data bus line BDref by sense amplifier 50.

Concurrently with the data read operation described above, non-selected bit lines BL1–BL3 and non-selected reference bit lines BLr1–BLr3 are precharged to the same potential (the ground potential in the present embodiment), in response to reset signals RST1–RST3 and reference reset signals RSTref1–RSTref3 at H level input to multiplexer 30 and reference multiplexer 41 respectively.

Therefore, even if bit line BL1 is successively selected by next column address CA, selected reference bit line BLr1 can perform the sensing operation immediately, because it has already completed precharging.

Even when bit line BL2 is successively selected by further next column address CA, corresponding reference bit line BLr2 can perform the sensing operation immediately, because it has already completed precharging.

As described above, the flash memory in the present embodiment includes four reference bit lines BLr0–BLr3, each one of which is driven to the selected state in one access period among successive four access periods, and performs a precharging operation in remaining three access periods. Therefore, even if a number of memory cells are connected to a bit line in accordance with higher integration, a sufficient precharge period can be ensured. Thus, successive data reading can be performed with high speed.

Here, the precharge period for the flash memory according to the present embodiment is substantially reduced to ¼ at the shortest, compared to that of the conventional flash memory including a single reference bit line. Thus, a significant reduction in the cycle time can be attained.

As described above, the flash memory according to the embodiment of the present invention is configured such that a plurality of reference bit lines are provided, and in the access period during which one reference bit line is selected, remaining reference bit lines are precharged. Thus, the increase in the precharge period due to higher integration can be suppressed, and further higher data transfer rate can be attained.

(Fourth Embodiment)

The flash memories according to the first to third embodiments described above have adopted a complementary sensing scheme in which the potential difference between data bus line BD and reference data bus line BDref connected to a sense amplifier is amplified for data reading. In the following, a sense amplifier used in such a complementary sensing scheme is also referred to as a dual sense amplifier.

Though this scheme is advantageous in achieving fast sensing speed by amplifying a difference, reference data bus line BDref is arranged for each dual sense amplifier. Accordingly, if the number of sense amplifiers that operate simultaneously for attaining high-speed data transfer increases, reference data bus lines BDref in the number corresponding to the number of sense amplifiers will be required, and area penalty will be considerable.

Meanwhile, examples of a sensing scheme include a single-end sensing scheme other than the complementary sensing scheme described above. In the single-end sensing scheme, data is identified by comparing the potential to which the data bus line is driven with a prescribed potential. Though this scheme is disadvantageous in a sensing speed slower than the complementary sensing scheme, it does not need reference data bus line BDref. Therefore, this scheme can effectively achieve smaller circuit size. In the following, a sense amplifier used in the single-end sensing scheme is also referred to as a "single sense amplifier".

The embodiment below will describe a configuration of a flash memory adapted to high-speed data transfer using the two sensing schemes described above. Here, it is assumed that the flash memory of the present embodiment has 16 external terminals DQ in total.

Figure 7:
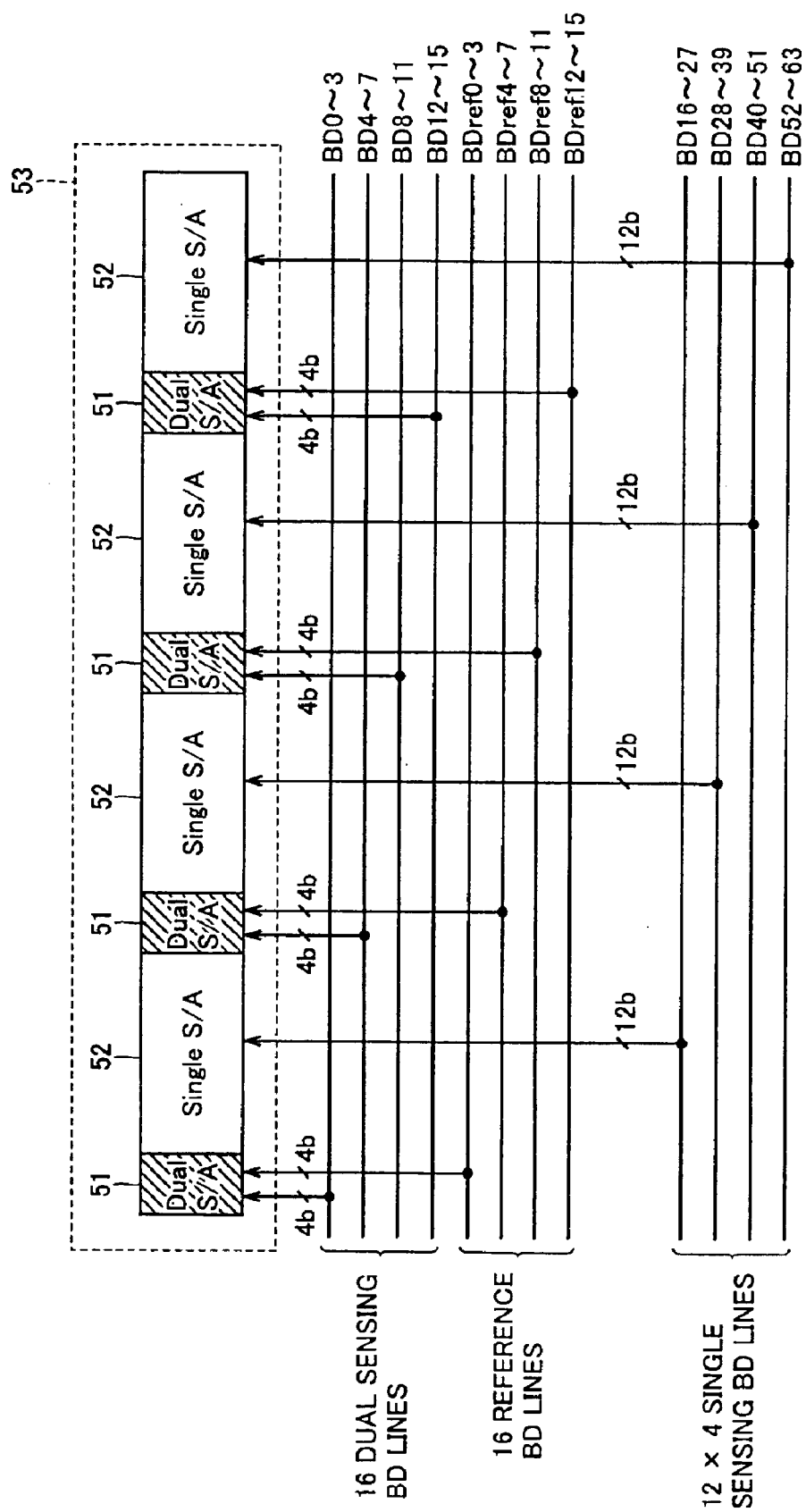
FIG. 7 schematically shows an example of a configuration of a portion involved in data reading in a flash memory according to a fourth embodiment of the present invention.

FIG. 7 schematically shows an example of a configuration of a portion involved in data reading in a flash memory according to a fourth embodiment of the present invention.

Referring to FIG. 7, the flash memory includes data bus lines BD0–BD63 (64 in total) transmitting a reading potential from not-shown each memory block, reference data bus lines BDref0–BDref15 (16 in total), and a sense amplifier band 53 to which data bus line BD and reference data bus line BDref are coupled.

Sense amplifier band 53 is constituted with 16 dual sense amplifiers 51 amplifying a potential difference between data bus line BD and reference data bus line BDref, and 48 single sense amplifiers 52 outputting the potential of data bus line BD.

Dual sense amplifiers 51 are arranged by dividing them into four groups within sense amplifier band 53, as shown with hatched areas in FIG. 7, and four dual sense amplifiers 51 are arranged in each area. Four data bus lines BD0–3, BD4–7, BD8–11, BD12–15 are coupled respectively to the areas where dual sense amplifiers 51 are arranged. In the following, data bus line BD coupled to dual sense amplifier 51 is collectively referred to as a "dual-sensing data bus line".

At the same time, corresponding four reference data bus lines BDref0–3, BDref4–7, BDref8–11, BDref12–15 are coupled respectively to the areas of dual sense amplifier 51. In the following, data bus line BD coupled to single sense amplifier 52 is collectively referred to as a "single-sensing data bus line".

As described above, the area of dual sense amplifier 51 is constituted with 16 dual sense amplifiers in which dual-sensing data bus lines BD0–15 are coupled to reference data bus lines BDref0–15 respectively.

On the other hand, single sense amplifiers 52 are arranged by dividing them into four groups within sense amplifier band 53. Twelve data bus lines BD16–27, BD28–39, BD40–51, BD52–63 are coupled to four groups of single sense amplifiers 52 respectively. Therefore, each area of single sense amplifier 52 in FIG. 7 is constituted with twelve single sense amplifiers.

Here, an example in which 64-bit data is read in the flash memory containing sense amplifier band 53 configured as above is considered.

In such an example, as the total number of external terminals DQ is set to 16, 64-bit data reading is performed with a scheme in which 16-bit data is transferred four times in succession. Therefore, in order to attain high-speed data reading, 64 bits are not necessarily sensed simultaneously, but only the first 16 bits should be read with high speed.

Accordingly, reading the first 16-bit data should be performed with a dual sense amplifier, in view of high speed attained by the complementary sensing scheme described above.

In FIG. 7, the reading potential to which the dual-sensing data bus lines BD0–3, BD4–7, BD8–11, BD12–15 are driven is sensed by dual sense amplifier 51. In the sensing operation, the potential difference between the data bus lines and reference data bus lines BDref0–3, BDref4–7, BDref8–11, BDref12–15 is amplified.

On the other hand, reading subsequent 48-bit data does not require such high speed as in reading the first 16 bits. Therefore, this reading can be performed by the single-end sensing scheme.

In FIG. 7, the reading potential to which the single-sensing data bus lines BD16–27, BD28–39, BD40–51, BD52–63 are driven is sensed by single sense amplifier 52.

When data reading is performed by selecting from two sense amplifiers from the viewpoint of reading speed in such a manner, the flash memory of the present embodiment is provided with 16 dual sense amplifiers and 48 single sense amplifiers. The number of reference data bus lines BDref required for data reading in this case should be set to 16, corresponding to 16 dual sense amplifiers 51.

On the other hand, if 64-bit data reading is performed only with the complementary sensing scheme, 64 reference bit lines corresponding to the number of bits to be read are necessary.

In other words, by implementing the configuration of the sense amplifier in the present embodiment, the number of reference bit lines to be arranged can significantly be reduced. Therefore, the increase in the circuit size can be suppressed without impairing high speed in the reading operation.

As described above, according to the fourth embodiment, successive data reading is performed by employing both the complementary sensing scheme and the single-end sensing scheme. Therefore, the increase in the circuit size can be suppressed without impairing high speed in data reading.

In addition, as the number of reference data bus lines is reduced, an amount of current consumed in precharging the reference data bus line is also reduced, thereby attaining low power consumption.

(Fifth Embodiment)

In a flash memory that has actually implemented higher integration, data bus line BD of the fourth embodiment shown in FIG. 7 is shared by a plurality of memory blocks or memory banks. One bit line BL is selected from a plurality of bit lines BL within one memory block in accordance with column address CA designated by an external address signal, and coupled to data bus line BD.

In order to successively read a plurality of pieces of data in such a flash memory as shown in the fourth embodiment, it is necessary to select bit line BL corresponding to the start address and to couple the selected bit line to the dual-sensing data bus line.

Accordingly, in the present embodiment, a specific configuration example of a flash memory for performing data reading in the fourth embodiment will be described.

Figure 8:
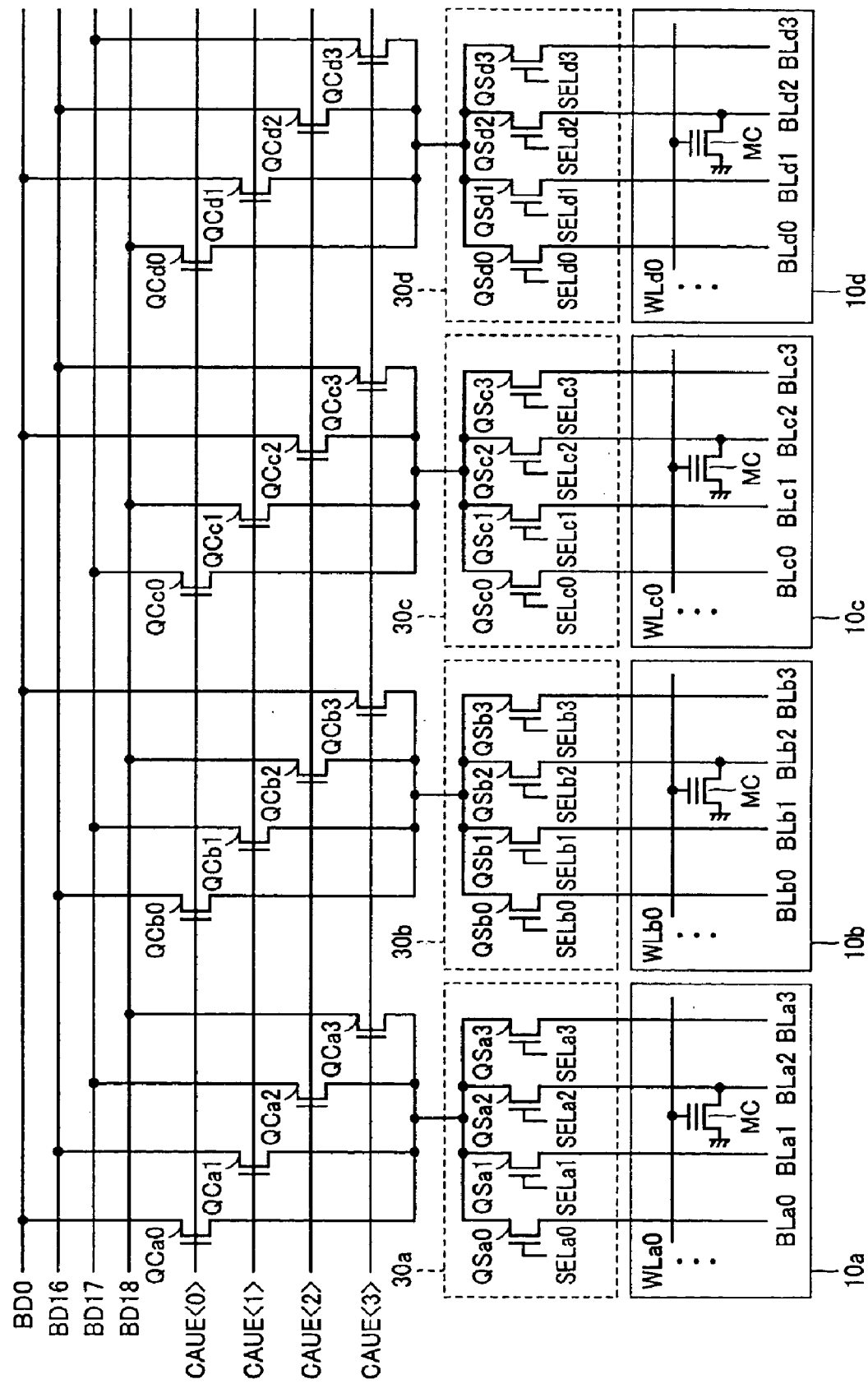
FIG. 8 extracts for illustration a portion involved in a column select operation of a flash memory according to a fifth embodiment of the present invention.

FIG. 8 extracts for illustration, a portion involved in a column select operation of a flash memory according to a fifth embodiment of the present invention.

Referring to FIG. 8, the flash memory includes one group of data bus lines consisting of four data bus lines BD0, BD16–18, and four memory blocks 10a–10d sharing the data bus line group.

Memory blocks 10a–10d have a configuration identical to memory block 10 in the first embodiment in FIG. 1 respectively. Word lines WLa0–WLan, WLb0–WLbn, WLc0–WLcn, WLD0–WLdn are arranged on memory blocks 10a–10d respectively, corresponding to each memory cell row in the plurality of memory cells MC. In addition, bit lines BLa0–BLa3, BLb0–BLb3, BLc0–BLc3, BLd0–BLd3 are arranged corresponding to each memory cell column. In the following, bit lines BLa0–BLa3, BLb0–BLb3, BLc0–BLc3, BLd0–BLd3 are collectively referred to as BLa, BLb, BLc, BLd, respectively.

One group of data bus lines is constituted with one dual-sensing data bus line BD0, and three single-sensing data bus lines BD16–18, as shown in the fourth embodiment.

As described, successive 4-bit data reading is performed by one group of data bus lines constituted with one dual-sensing data bus line BD and three single-sensing data bus lines BD. Though not shown, dual-sensing data bus line BD1 and single-sensing data bus lines BD19–21, dual-sensing data bus line BD2 and single-sensing data bus lines BD22–25, . . . , dual-sensing data bus line BD15 and single-sensing data bus lines BD61–63 constitute one group of data bus lines respectively. In other words, data bus line BD is constituted with the total of 16 groups of data bus lines, and performs 64-bit data reading operation.

Multiplexers 30a–30d performing column selection are arranged between memory blocks 10a–10d and data bus lines BD0, BD16–18 respectively, in accordance with column select signal SEL, which is a decode result of column address CA.

Multiplexers 30a–30d are configured in a manner similar to that in the first embodiment, and column select signals SELa0–3, SELb0–3, SELc0–3, SELd0–3 are input respectively to the N-channel transistors contained therein. If any one of these column select signals SEL is activated in accordance with column address CA, corresponding one bit line BL is driven to the selected state, and the reading potential of one bit is transmitted to data bus line BD.

Here, when one bit line is selected from four bit lines BL in each memory block 10a–10d, 2-bit low-order address CA<1:0>(=CA<1>, CA<0>) of column address CA is decoded by a not-shown decoder, and any one of column select signals SEL0–SEL3, which are decode results, is activated to H level. In this manner, corresponding one bit line BL enters the selected state.

N-channel transistors QCa0–QCa3, QCb0–QCb3, QCc0–QCc3, QCd0–QCd3 are further coupled between multiplexers 30a–30d and data bus lines BD0, BD16–18 as connection switching circuits for selectively coupling the reading potential of selected bit line BL to any one of data bus lines BD0, BD16–18 in one group of data bus lines. In the following, N-channel transistors QCa0–QCa3, QCb0–QCb3, QCc0–QCc3, QCd0–QCd3 are collectively referred to as QCa, QCb, QCc, QCd respectively.

For example, when bit line BLa within memory block 10 is selected, selected bit line BLa is coupled to data bus line BD0, BD16–18 through N-channel transistors QCa0–QCa3 respectively.

Similarly, when bit line BLb within memory block 10b is selected, selected bit line BLb is coupled to data bus line BD16–18, BD0 through N-channel transistors QCb0–QCb3.

Similarly, when bit line BLc within memory block 10c is selected, selected bit line BLc is coupled to data bus line BD17, BD18, BD0, BD16 through N-channel transistors QCc0–QCc3.

Similarly, when bit line BLd within memory block 10d is selected, selected bit line BLd is coupled to data bus line BD18, BD0, BD16, BD17 through N-channel transistors QCd0–QCd3.

The gates of N-channel transistors QCa0–QCa3 receive column address enable signal CAUE<3:0>(=CAUE<3>–CAUE<0>) respectively. Therefore, N-channel transistor QCa electrically couples/decouples selected bit line BLa to/from data bus line BD, in response to activation/inactivation of column address enable signal CAUE<3:0>.

Similarly, the gates of N-channel transistors QCb0–QCb3, QCc0–QCc3, QCd0–QCd3 receive column address enable signal CAUE<3:0> respectively. Therefore, N-channel transistors QCb, QCc, QCc electrically couple/decouple selected bit lines BLb, BLc, BLd to/from data bus line BD, in response to activation/inactivation of column address enable signal CAUE<3:0>.

Here, column address enable signal CAUE refers to a control signal for coupling bit line BL corresponding to the start address among bit lines BL successively selected by column address CA to dual-sensing data bus line BD.

Here, the start address is designated corresponding to 2-bit column address CA<3:2>(=CA<3>, CA<2>). Specifically, start address 0# is designated corresponding to [0,0] from the high order bit side of column address CA<3:2>; start address 1# is designated corresponding to [0,1] from the high order bit side of column address CA<3:2>; start address 2# is designated corresponding to [1,0] from the high order bit side of column address CA<3:2>; and start address 3# is designated corresponding to [1,1] from the high order bit side of column address CA<3:2>.

Figures 9A, 9B:
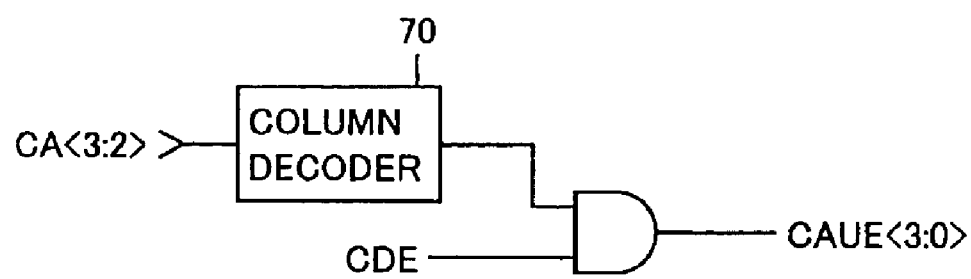
FIGS. 9A and 9B illustrate corresponding relation between a column address CA<3:2> and a column address enable signal CAUE<3:0>.

FIGS. 9A and 9B illustrate corresponding relation between column address CA<3:2> and column address enable signal CAUE<3:0>.

As shown in FIG. 9A, column address enable signal CAUE is generated as an operation result of a logical sum of a decode result of 2-bit column address CA<3:2> and a column decoder enable signal CDE.

Referring to FIG. 9B, when column address CA<3:2> is set to [0,0] from the high order bit side (=start address is set to 0#), column address enable signal CAUE<3:0> attains [L, L, L, H] from the high order bit side.

In addition, when column address CA<3:2> is set to [0,1] from the high order bit side (=start address is set to 1#), column address enable signal CAUE<3:0> attains [H, L, L, L] from the high order bit side.

When column address CA<3:2> is set to [1,0] from the high order bit side (=start address is set to 2#), column address enable signal CAUE<3:0> attains [L, H, L, L] from the high order bit side.

When column address CA<3:2> is set to [1,1] from the high order bit side (=start address is set to 3#), column address enable signal CAUE<3:0> attains [L, L, H, L] from the high order bit side.

As described above, start addresses 0#–3# are designated corresponding to column address CA<3:2>. In addition, column address enable signal CAUE<3:0>, in which only one signal attains H level whereas other three signals attain L level, is generated.

Referring again to FIG. 8, column address enable signal CAUE<3:0> is input to N-channel transistors QCa, QCb, QCc, QCd, respectively.

For example, when column address CA<3:2> is set to [0,0] from the high order bit side (=start address is set to 0#), column address enable signal CAUE<3:0> attains [L, L, L, H] from the high order bit side, and N-channel transistors QCa0, QCb0, QCc0, QCd0 receiving CAUE<0> are turned on. In this manner, selected bit lines BLa-BLd in memory blocks 10a–10d are coupled to data bus lines BD0, BD16, BD17, BD18, respectively.

In other words, when the start address is set to 0#, bit line BLa within corresponding memory block 10a is selected and coupled to dual-sensing data bus line BD0. Therefore, the reading potential of selected bit line BLa is sensed with high speed by a not-shown dual sense amplifier.

On the other hand, remaining three selected bit lines BLb, BLc, BLd selected by subsequent addresses are coupled to single-sensing data bus lines BD16–BD18 respectively. Therefore, the reading potentials of selected bit lines BLb, BLc, BLd are sensed with the single-end sensing scheme.

As a result, when bit lines BLb, BLc, BLd are successively selected with bit line BLa corresponding to start address 0# in the lead, corresponding reading potential is serially output from not-shown external terminal DQ.

Similarly, when start address is set to 1#, column address enable signal CAUE<3:0> attains [H, L, L, L] from the high order bit side, and N-channel transistors QCa3, QCb3, QCc3, QCd3 receiving CAUE<3> at H level are turned on. In this manner, selected bit lines BLa–BLd in memory blocks 10a–10d are coupled to data bus lines BD18, BD0, BD16, BD17 respectively.

Therefore, when the start address is set to 1#, bit line BLb within corresponding memory block 10b is selected and coupled to dual-sensing data bus line BD0. Therefore, the read data of selected bit line BLa is sensed with high speed by a not-shown dual sense amplifier.

On the other hand, remaining three selected bit lines BLc, BLd, BLa selected by subsequent addresses are coupled to single-sensing data bus lines BD16–BD18 respectively. Therefore, the read data of selected bit lines BLc, BLd, BLa are sensed with the single-end sensing scheme respectively.

As described above, only bit line BL corresponding to the start address is selectively coupled to dual-sensing data bus line BD by column address enable signal CAUE<3:2>, thereby attaining high-speed reading of data corresponding to the start address. Here, data corresponding to the next address is read subsequently by the single sense amplifier.

When column address enable signal CAUE<3:0> varying its logic level in accordance with the start address designated by column address CA is used, coupling between bit line BL corresponding to the start address and dual-sensing data bus line BD can readily be switched.

As described above, according to the fifth embodiment of the present invention, in a mode in which successive data reading is performed using both the dual sense amplifier and the single sense amplifier, coupling between the bit line corresponding to the start address and the dual-sensing data bus line can readily be switched by the column address enable signal generated associated with the start address. Thus, higher data transfer rate can readily be attained in the flash memory that has implemented higher integration.

(Sixth Embodiment)

The flash memories in the fourth and fifth embodiments described above have attained both higher data transfer rate and smaller circuit size, by implementing such a configuration that the bit line corresponding to the start address is sensed with the complementary sensing scheme and the bit line corresponding to the subsequent address is sensed by the single-end sensing scheme in the mode where a plurality of pieces of data are successively read.

In the present embodiment, a method of performing data reading in a random access mode where data is transferred by designating an arbitrary address in the flash memory having the present configuration will be described.

Since the flash memory according to the present embodiment has a configuration identical to that shown with reference to FIGS. 7 and 8, detailed description thereof will not be provided.

Figure 10:
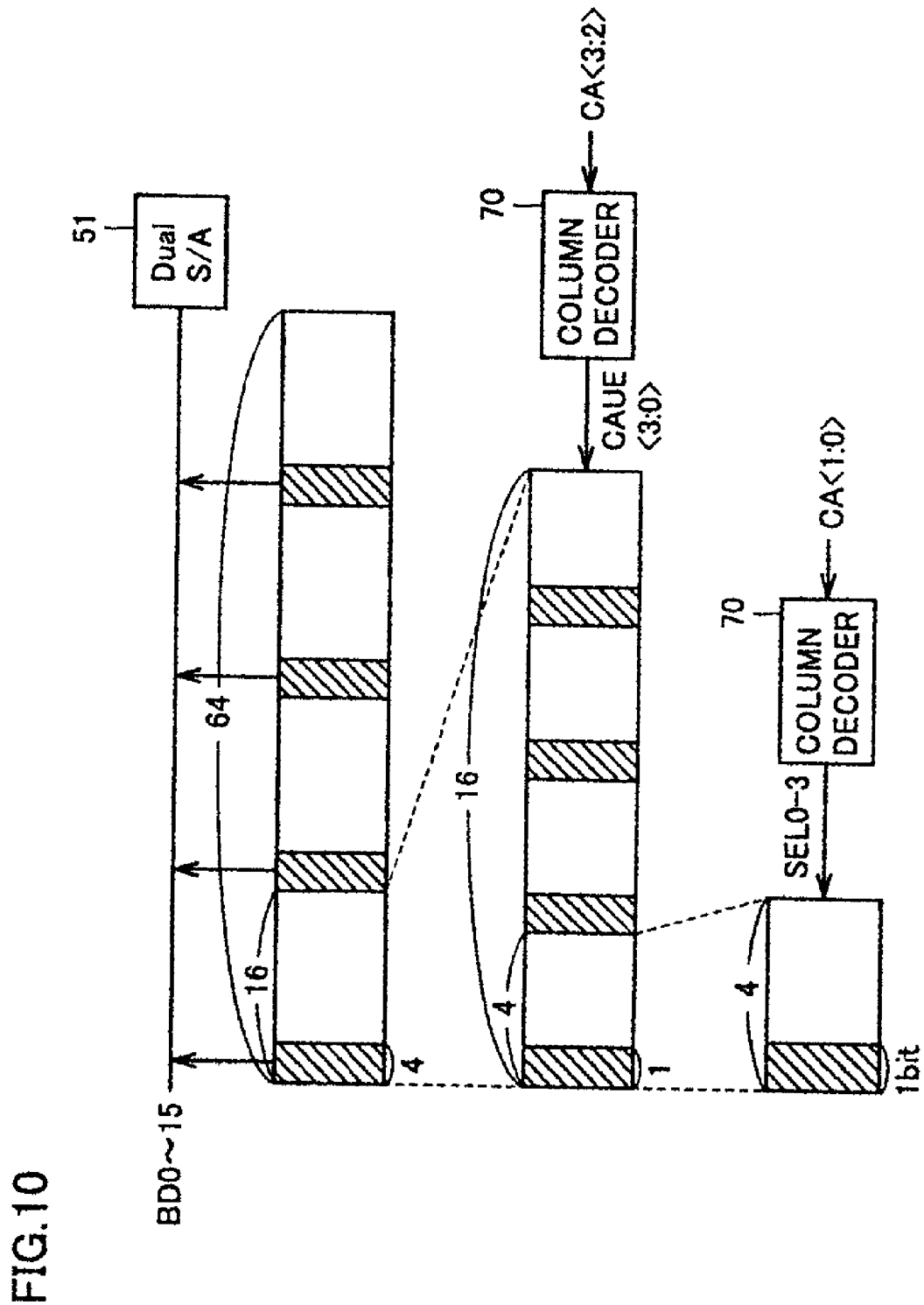
FIG. 10 illustrates a data reading operation when a 16-bit random access mode is selected in a flash memory.

FIG. 10 illustrates a data reading operation when a 16-bit random access mode is selected in a flash memory.

In the fourth and fifth embodiments, a configuration in which only the first 16-bit data is sensed with high speed by dual sense amplifier 51 when 64-bit data is successively transferred has been described.

On the other hand, in the present embodiment, 16 bits are accessed in a random manner. Therefore, if 16-bit data is read by dual sense amplifier 51 in the present configuration, high-speed operation can be maintained.

Referring to FIG. 10, one bit line is selected from four bit lines BL constituting one memory block by column select signals SEL0–3 which are decode results of column address CA<1:0>, and driven to 1-bit reading potential.

In addition, when one memory block is selected from four memory blocks sharing one data bus line BD by column address enable signal CAUE<3:0> which is a decode result of column address CA<3:2>, 1-bit reading potential is transmitted to one dual-sensing data bus line BD.

In this manner, 1-bit reading potential is transmitted to dual-sensing data bus lines BD0–15 respectively.

Moreover, the reading potential of the total of 16 bits transmitted to data bus lines BD0–15 is detected by amplifying the potential difference between the data bus lines and reference data bus lines BDref0–15 (not shown) corresponding to data bus lines BD0–15 respectively in dual sense amplifier 51.

Here, in the not-shown single sense amplifier, corresponding data bus lines BD16–63 (not shown) are inactive. Therefore, the sensing operation is not performed.

As such, in the 16-bit random access mode, data reading is performed only by dual sense 51. Thus, high-speed operation is ensured.

As described above, according to the sixth embodiment of the present invention, in order to implement successive data reading, when the random access mode is selected in the flash memory having the sense amplifier band constituted with the dual sense amplifier and the single sense, data reading is performed by operating only the dual sense amplifier. Thus, high data transfer rate can be maintained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device, comprising:

a plurality of memory blocks having a plurality of memory cells each arranged in matrix of rows and columns;

a plurality of word lines provided corresponding to said rows in said memory cell respectively;

a plurality of bit lines provided corresponding to said columns in said memory cell respectively;

a data bus line transmitting a potential of said bit line;

a column select circuit electrically coupling one bit line selected from said plurality of bit lines in accordance with a column select result to said data bus line;

a reference memory block having a plurality of reference memory cells arranged in matrix of rows and columns;

a plurality of reference word lines provided corresponding to said rows in said reference memory cell respectively;

a plurality of reference bit lines provided corresponding to said columns in said reference memory cell respectively;

a reference data bus line transmitting a potential of said reference bit line;

a reference column select circuit electrically coupling one reference bit line selected from said plurality of reference bit lines in accordance with a column select result to said reference data bus line; and a sense amplifier arranged corresponding to said data bus line and said reference data bus line, and amplifying a potential difference between said data bus line and said reference data bus line; wherein said column select circuit precharges remainder of said bit lines in a non-selected state to a prescribed potential during a data reading period in which one of said plurality of bit lines is driven to a selected state, and said reference column select circuit precharges remainder of said reference bit lines in a non-selected state to said prescribed potential during a data reading period in which one of said plurality of reference bit lines is driven to a selected state.

2. The non-volatile semiconductor memory device according to claim 1, wherein said reference column select circuit selects one of said plurality of reference bit lines in accordance with a column select signal, which is a decode result of a low order bit of a column address for selecting a column in said plurality of memory cells, and electrically couples the selected reference bit line to said reference data bus line.

3. The non-volatile semiconductor memory device according to claim 2, wherein said reference column select circuit electrically couples the reference bit line in a non-selected state among said plurality of reference bit lines to a precharge potential, in response to a reset signal activated during a period in which said column select signal is inactivated.

4. The non-volatile semiconductor memory device according to claim 1, wherein in a burst mode in which data is successively transferred by a burst length defined by a high order bit of a column address, said reference column select circuit precharges a first reference bit line and said bit line corresponding to a next address designated in an ascending order to said prescribed potential during a data reading period in which a second reference bit line and said bit line corresponding to a start address designated in accordance with said column address are driven to a selected state, and precharges said second reference bit line and said bit line corresponding to further next address designated in an ascending order in a data reading period in which said first reference bit line and said bit line corresponding to said next address are driven to a selected state.

5. The non-volatile semiconductor memory device according to claim 1, further comprising a plurality of connection switching circuits arranged between each of said plurality of memory blocks sharing said reference memory block and said reference memory block, wherein said plurality of connection switching circuits couple one memory block selected from said plurality of memory blocks corresponding to a column address to said reference memory block.

6. The non-volatile semiconductor memory device according to claim 1, wherein said sense amplifier forms a sense amplifier band constituted with a first sense amplifier amplifying a potential difference between a first data bus line and said reference data bus line, and a second sense amplifier outputting a potential of a second data bus line, and said non-volatile semiconductor memory device further includes first data reading means for selecting and coupling said reference bit line and said bit line corresponding to a start address to said first data bus line and said reference data bus line respectively, and amplifying a potential difference between said first data bus line and said reference data bus line in said first sense amplifier in a mode in which a plurality of pieces of data are successively transferred, and second data reading means for selecting and coupling said bit line corresponding to a subsequent address to said second data bus line, and outputting a potential of said second data bus line in said second sense amplifier.

7. The non-volatile semiconductor memory device according to claim 6, further comprising a connection switching circuit coupled between said column select circuit and said first and second data bus lines, wherein said connection switching circuit electrically couples a bit line corresponding to said start address to said first data bus line in response to activation of a control signal generated based on said start address, and electrically couples a bit line corresponding to said subsequent address to said second data bus line in response to inactivation of said control signal.

* * * * *